US008665026B2

(12) United States Patent
Mikhemar et al.

(10) Patent No.: US 8,665,026 B2
(45) Date of Patent: Mar. 4, 2014

(54) GAIN CONTROL SYSTEM

(75) Inventors: Mohyee Mikhemar, Aliso Viejo, CA (US); Hooman Darabi, Laguna Niguel, CA (US)

(73) Assignee: Broadcom Corporation, Irvine, CA (US)

(*) Notice: Subject to any disclaimer, the term of this patent is extended or adjusted under 35 U.S.C. 154(b) by 50 days.

(21) Appl. No.: 13/419,652

(22) Filed: Mar. 14, 2012

(65) Prior Publication Data

US 2013/0241654 A1 Sep. 19, 2013

(51) Int. Cl.
*H03G 3/00* (2006.01)

(52) U.S. Cl.
USPC .......................................... 330/278; 330/254

(58) Field of Classification Search
USPC .............. 330/252–261, 295, 124 R, 310–311
See application file for complete search history.

(56) References Cited

U.S. PATENT DOCUMENTS 7,589,593 B2* 9/2009 Lai et al. ...................... 330/295

OTHER PUBLICATIONS

"Design of Analog CMOS Integrated Circuits," Behzad Razavi, Ch. 7, pp. 228-333 (2000).

* cited by examiner

*Primary Examiner* — Hieu Nguyen
(74) *Attorney, Agent, or Firm* — Brinks Gilson & Lione

(57) ABSTRACT

A gain control system may include an input terminal that receives an input signal. The gain control system may include a first transistor having a source connected with the input terminal and a drain connected with an output terminal. The gain control system may include a second transistor having a gate connected with the input terminal and the source of the first transistor. The second transistor may have a drain connected with the output terminal. The second transistor may generate a reduction signal. The output terminal may output an output signal based on the input signal and the reduction signal.

20 Claims, 11 Drawing Sheets

GAIN CONTROL SYSTEM

TECHNICAL FIELD

This disclosure relates to gain control systems and methods (generally referred to as systems). More specifically, this disclosure relates to electronic devices utilizing an amplifier with a gain control system.

BACKGROUND

Amplifiers are used in electronic devices to increase the power level of a signal by use of an external voltage or energy source. For example, amplifiers may be used to drive loudspeakers in some audio systems to increase a volume level of an input signal. Amplifiers may be constructed or composed in various ways and may include different components and configurations.

BRIEF DESCRIPTION OF THE DRAWINGS

The system may be better understood with reference to the following drawings and description. In the figures, like reference numerals designate corresponding parts throughout the different views.

DETAILED DESCRIPTION

Figure 1:
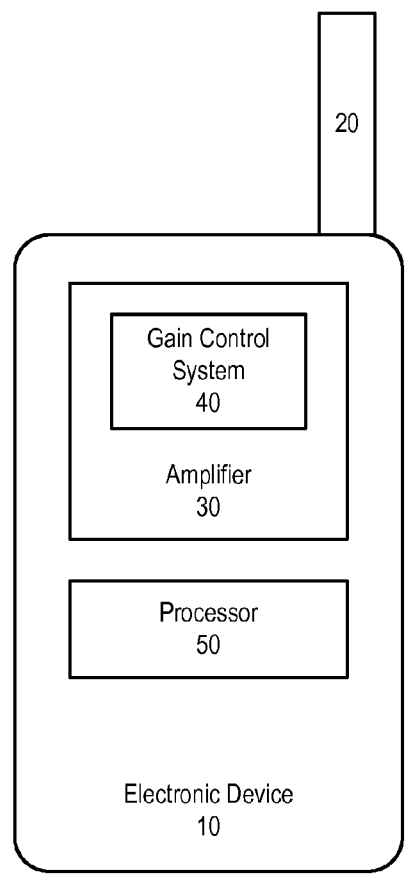
FIG. 1 is a block diagram of an example electronic device with an amplifier.

FIG. 1 is block diagram of an example electronic device 10. The electronic device 10 may be or include one or more devices, such as a mixing board, audio console, a wireless telephone, a mobile device or mobile phone, a smart phone, a communications device, a tablet, a personal computer (PC), a set-top box (STB), a personal digital assistant (PDA), a palmtop computer, a laptop computer, a desktop computer, a landline telephone, a control system, a camera, a scanner, a facsimile machine, a printer, a pager, a personal trusted device, a web appliance, a network router, switch or bridge, or any other machine that may receive an input signal and include an amplifier.

The electronic device 10 may include a receiver 20. The receiver may be configured to receive on or more input signals, such as one or more input alternating current signals, audio signals, video signals, electromagnetic signals, or various other signals. In electronic devices 10 such as a cellular or smart phone, the receiver 20 may be or include a transceiver such as an antenna. In other systems, the electronic device 10 may have an input port which through which signals may be transmitted to the electronic device.

The electronic device 10 may include one or more amplifiers 30. The amplifier 30 may amplify or reduce a power level of a signal received by the receiver 20. The amplifier 30 may include one or more gain control systems 40 which may control a gain of an amplifier. The electronic device 10 may also or alternatively include one or more processors 50 or other computer systems. The processor 50 may control one or more of the gain control system 40, the amplifier 30, or a gain of the amplifier 30. The electronic device 10 may include additional components, such as one or more of those components of computer system 1000 discussed later. In other systems, the electronic device 10 may include fewer components.

Figure 2:
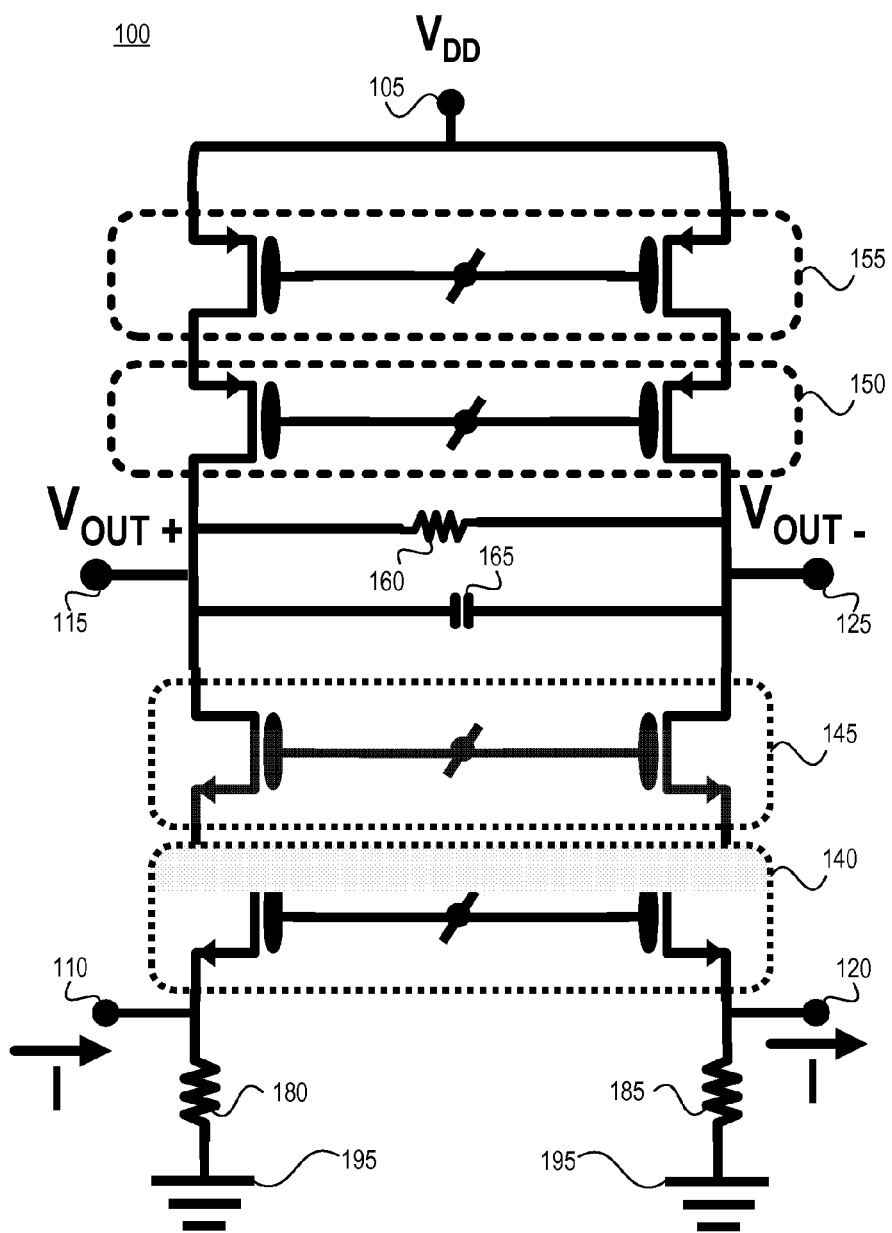
FIG. 2 is a block diagram of an example amplifier.

FIG. 2 is a block diagram of an example amplifier 100 that may be used with the electronic device 10 as amplifier 30. The amplifier 100 may, for example, be a common gate transimpedance amplifier which may convert an input current into an output voltage. The amplifier 100 may be used with or accessed by, for example, a mixer or a receiver in an audio console. Various other uses or operations of the amplifier 100, such as with any signal processing system, are possible.

The amplifier 100 may be configured or operable to receive an input signal. The input signal received by the amplifier 100 may be an alternating current signal, and may or may not have a frequency. The input signal may be expressed in terms of current or voltage. For example, an input signal may be expressed as $I_{IN}$, $V_{IN+}$ or may be expressed as an alternating current input.

In some systems, the amplifier 100 may receive an input signal at an input point or input terminal, such as input terminal 110. In other systems, the amplifier 100 may receive an input signal at two or more points, such as at input terminals 110 and 120. For example, the amplifier 100 may receive a differential input signal at input terminals 110 and 120. The input signal received at input terminal 110 may have the same power or amplitude as the input signal received at input terminal 120 (or may be the same input signal received at input terminal 120), but may have an opposite polarity. In other systems, only one input terminal 110 may be used and only one input signal may be received by the amplifier 100.

One or more source resistors 180 and 185 may be arranged or configured between an input terminal 110 and ground, and may be used to maintain a voltage at the input terminals 110 and 120. Other examples of input terminal configurations or source resistor configurations are possible.

The amplifier 100 may include, be driven, or be powered by a power source 105. The power source 105 may be a voltage source, such as voltage source $V_{DD}$, a current source, or another power source. The power source 105 may provide power to one or more components of the amplifier 100. For example, the power source 105 may provide a voltage or current to one or more of the gain control systems 140 or 145, cascode device 150, current source 155, a load resistance component 160, or a load capacitance component 165.

The amplifier 100 may include one or more cascode device 150. The amplifier 100 may also or alternatively include one or more current sources 155. The cascode device 150 and the current source 155 may form a cascode current source. The cascode current source formed by the cascode device 150 and the current source 155 may provide a current for one or more other components of the amplifier 100, such as for the gain control systems 140 and 145. For example, the cascode current source may provide a direct current ("DC") for the gain control systems 140 and 145. The cascode current source may additionally or alternatively set or control a common-mode voltage level at the output of the amplifier 100. Additionally or alternatively, the cascode current source may present a small-signal output impedance. The small-signal output impedance may be large, such as much larger than an impedance of the resistor 160. The small-signal output impedance may improve a linearity of the amplifier 100. Other variations and uses of the cascode device 150 and current source 155 are possible.

Additionally or alternatively, one or more components of the amplifier, such as one or more gain control systems 140 and 145, may be used to control a gain of the amplifier and reduce the gain if desired. Gain control systems 140 and 145 may be implemented between an input terminal 110 and an output terminal 115 of the amplifier 100. Though two gain control systems 140 and 145 are shown in amplifier 100, in some systems, only one gain control system 140 may be included with the amplifier 100. In other systems, more than two gain control systems 140 and 145 may be included with the amplifier 100. A number of gain control systems 140 and 145 used in an amplifier 100 may depend on an application of the amplifier and a degree of gain control desired or necessary for the amplifier 100. The gain or gain reduction provided by each of a gain control system 140 and 145 in the amplifier 100 may be multiplied to provide a total gain of the amplifier 100. Other examples and configurations are possible.

The amplification or gain provided by the amplifier 100 or one or more of the gain control systems 140 and 145 may be the ratio of an output power or amplitude to an input power or amplitude. For example, the gain of the amplifier 100 may be related to or expressed using a ratio of an output current or voltage to an input voltage or current, such as a ratio of $V_{OUT+}$ to $I_{IN+}$, or $V_{OUT-}$ to $I_{IN-}$. Where the amplifier 100 is a transimpedance amplifier, the gain may be expressed as impedance or in terms of ohms. Gain may be measured in decibels. For example, the gain (G) may be determined or expressed as $G(dB)=20 \log(V_{OUT+}/I_{N+})$.

The amplifier 100 may output an amplified signal at one or more output points or output terminals 115 and 125. The output signal may or may not have a frequency. The output signal may be expressed in terms of voltage or current. For example, the output signal may be expressed as $V_{OUT+}$, $V_{OUT-}$, or an alternating current output.

In some systems, the amplifier 100 may output an amplified signal at one point, such as output terminal 115. In other systems, the amplifier 100 may output an amplified signal at two or more points 115 and 125. For example, the amplifier 100 may amplify a differential signal and output a positive amplified signal at output terminals 115 and a negative amplified signal at output terminal 125. The amplified signal output at output terminal 115 may have the same power or amplitude as the amplified signal output at output terminal 125, or may be the same amplified signal output at output terminal 125, but may have an opposite polarity.

In some systems, one or more impedance components, such as a resistive component 160 or a capacitive component 165, may be used as a load between two output terminals 115 and 125 of an amplifier 100. For example, where a differential input signal is amplified by the amplifier 100, a resistive component 160 or a capacitive component 165 or both may be connected in parallel between the two output terminals 115 and 125 of the amplifier 100. As an example, $V_{OUT+}$ and $V_{OUT-}$ may represent an output of the amplifier 100 loaded by the impedance of the amplifier, which may, for example, be the impedance of the resistive component 160 and the capacitive component 165. The use and selection of an impedance component with the amplifier 100 may be determined by the application of the amplifier 100.

In other systems, only one output terminal 115 may be used or needed with the amplifier 100. For example, where a single input signal is received and amplified, the single input signal may be output at the output terminal 115. Other examples are possible.

The amplifier 100 may provide differential loading, which may provide area savings over other amplifiers. The amplifier 100 may have current-steering gain control, such as with gain control systems 140 and 145. The amplifier 100 may provide a wide range of gain control, such as up to or greater than 30 dB of gain control.

Figure 3:
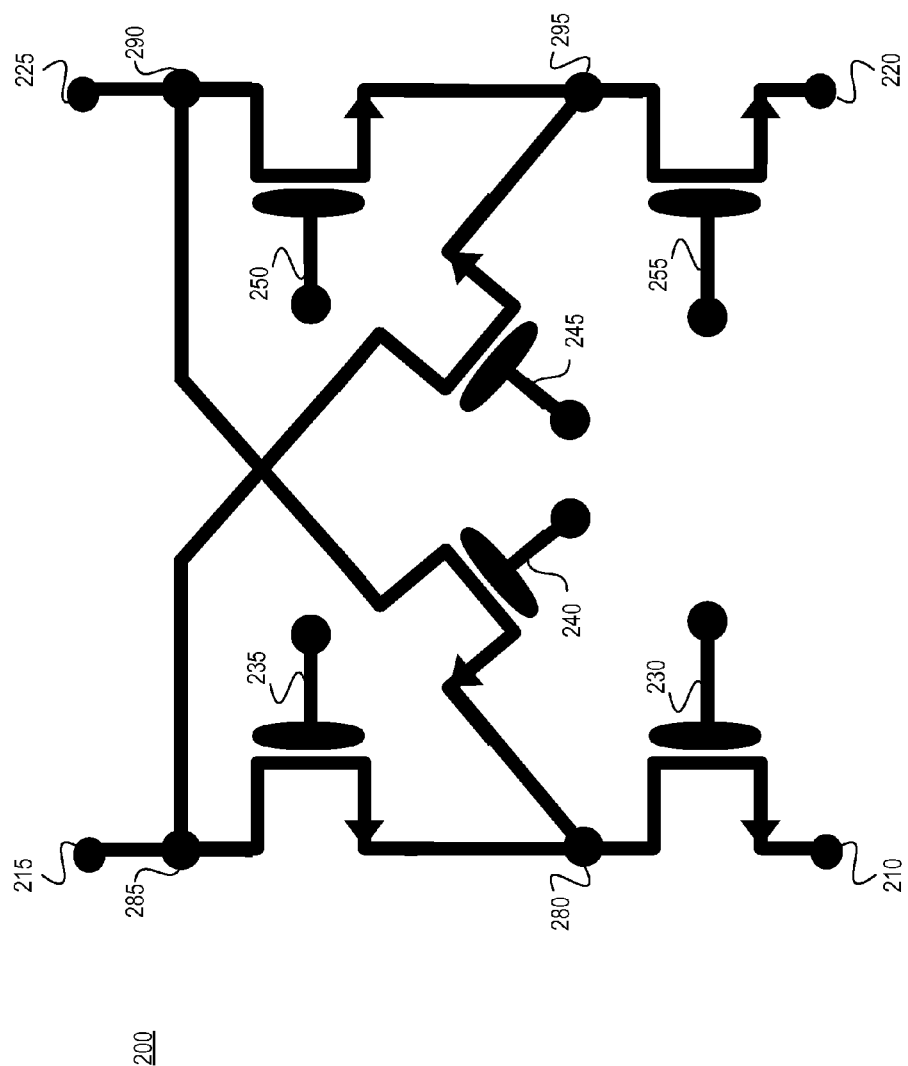
FIG. 3 is a block diagram of an example gain control system in an amplifier.

Gain control systems 140 and 145 may configured in various ways and include one or more resistors, capacitors, transistors, and switches. FIG. 3 shows an example of a gain control system 200 that may be incorporated in the amplifier 100. The gain control system 200 may be referred to as a reconfigurable cross-coupled common-gate stage, or alternatively as a cross-coupled common gate ("CG") amplifier.

The gain control system 200 may be operable or configured to provide gain control for a differential input signal, and may include two input terminals 210 and 220. Input terminal 210 may receive a positive portion of the differential input signal, and the input terminal 220 may receive the opposite, negative portion of the differential input signal.

The gain control system 200 may include two output terminals 215 and 225, which may output the amplified signal. The output terminal 215 may output the positive portion of the amplified differential input signal, and the output terminal 225 may output the opposite, negative portion of the differential input signal.

The gain control system 200 may include one or more components between the input terminals 210 and 220 and the output terminals 215 and 225, such as one or more transistors, which may amplify an input signal and provide a gain control. As an example, the gain control system 200 may include one or more field effect transistors ("FETs"), such as one or more metal-oxide-semiconductor field-effect transistor ("MOSFETs") 230, 235, 240, 245, 250, and 255. Some or all of the one or more transistors 230, 235, 240, 245, 250, and 255 may be n-channel MOSFETs or p-channel MOSFETs. In some systems, other FET transistor types, such as CMOS or other FET transistors, or other transistors such as bipolar (junction) transistors ("BJTs") may be used. In some systems, one or more resistors, capacitors, switches, or other components may also or alternatively be included with the gain control system 200.

Each of the transistors 230, 235, 240, 245, 250, and 255 may be configured or manufactured to have an impedance value. For example, where one or more of the transistors 230, 235, 240, 245, 250, and 255, are MOSFETs, the MOSFETs may be configured to have one or more fingers. Fingers may represent how wide, or how many parallel transistor gates, may be created or included with each transistor. A number of fingers may be inversely related to an impedance of the transistor. Other examples or ways of changing an impedance value of a transistor, such as by changing a size or area of a transistor, are possible.

The arrangement, impedance, and power delivered to the one or more transistors 230, 235, 240, 245, 250, and 255 in the cross-coupled gain control system 200 may split or direct an input current received at the input terminals 210 and 220 through the gain control system 200 and control a gain reduction of the gain control system 200. For example a positive input alternating current may enter the gain control system 200 at input terminal 210. If the first transistor 230 is powered on or otherwise operating, the entire positive input alternating current may flow through the first transistor 230. The current may pass to junction point 280 of the gain control system 200.

If the transistors 240 and 245 are not powered on or operable, the circuit may be simplified, and all of the current from the transistor 230 flows to and through the transistor 235 and to the output terminal 215. The opposite may occur on the opposite side of the gain control system 200, where a negative current may flow directly from the input terminal 220, through the transistors 255 and 250 and to the output terminal 225 (or a positive current may flow in the reverse direction).

Figure 4:
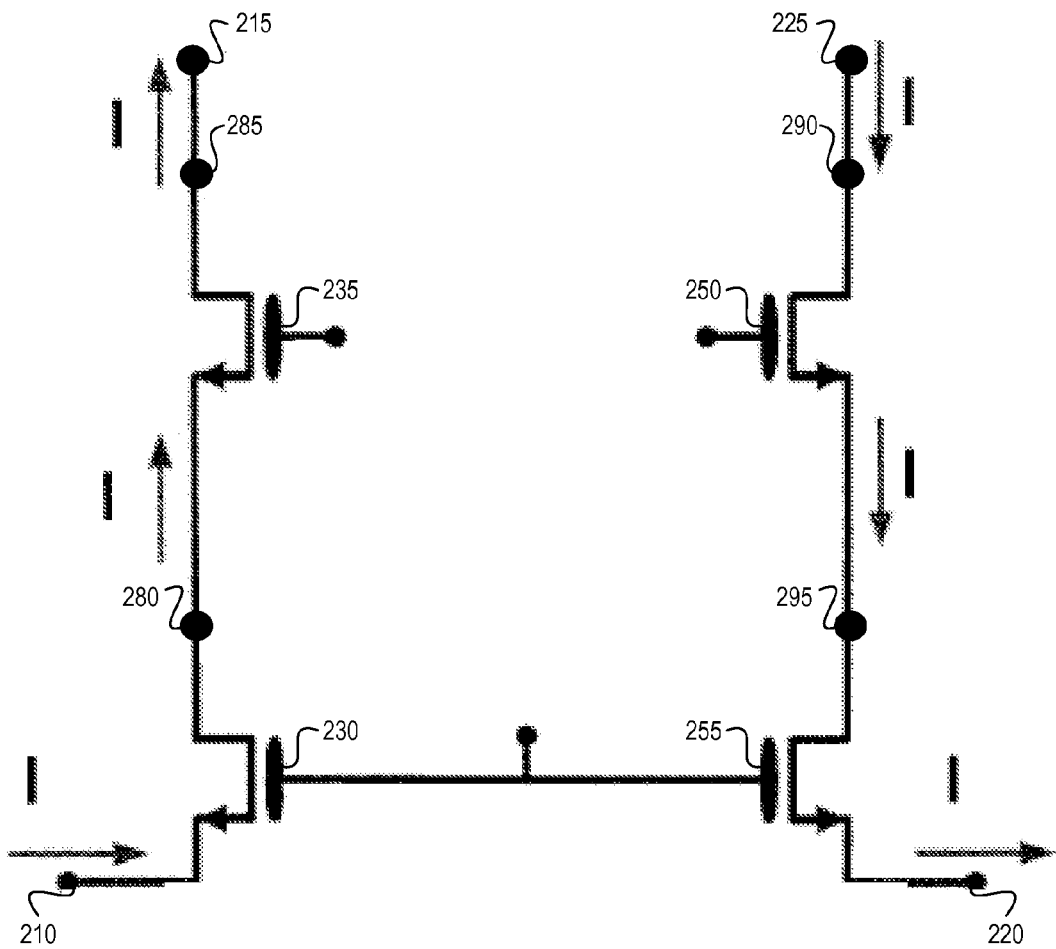
FIG. 4 is a block diagram of an example operation of a gain control system in an amplifier.

FIG. 4 shows a numerical example block diagram of the cross-coupled gain control system 200 when the transistors 240 and 245 are disabled or powered off. An input current ("I") is input into the gain control system 200 at input terminal 210. All of the current I goes through the transistor 230 and to junction point 280. Because transistor 240 is disabled, the current at block 280 must all pass to and flow through the transistor 235. The current then reaches junction point 285. Because transistor 245 is also disabled or powered off, all of the current goes from junction point 285 to the output terminal 220. The reverse situation occurs on the other side of the gain control system 200, where the negative current flows through transistor 255, junction point 295, transistor 250, and junction point 290 before out at the output terminal 225 (or the positive current flows in the opposite direction).

In the system of FIG. 4, the gain control system 200 may not reduce a gain of the amplifier 100 at all. Rather, a gain of the gain control system 200 may be:

$$\text{Gain} = (I_{OUT+}/I_{IN+}) = 1$$

$$G(\text{dB}) = 20 \log(I_{OUT+}/I_{IN+}) = 20 \log(1) = 0.$$

As such, the gain of the amplifier 100 may be the maximum gain for the amplifier 100.

Returning to FIG. 3, if instead at the junction point 280 both of the transistors 235 and 240 are on and operating, the current from the transistor 230 may split or divide. A portion of the input current may flow to and through the transistor 235, and the remainder of the current may flow to and through the transistor 240. Current division in the gain control system 220 may relate to or depend on a ratio of input impedances of possible current paths. For example, the division of current through the transistors 235 and 240 may relate to or depend on an input impedance of the transistors 235 and 240 ($Z_{235}$ and $Z_{240}$ respectively). The current may divide as follows:

$$I_{to\ T235} = Z_{240}/(Z_{240}+Z_{235})$$

$$I_{to\ T240} = Z_{235}/(Z_{240}+Z_{235})$$

where $I_{to\ T235}$ represents the ratio of current flowing to the transistor 235 to the input current I, and where $I_{to\ T240}$ represents the ratio of the current flowing to transistor 240 to the input current I. A similar division of current may occur with transistors 245, 250, and 255, but with a reverse polarity.

The current that passes through transistor 235 may reach another junction point 285, where again the current may split or divide between the transistor 245 and the output terminal 215. The split or division at junction point 285 may depend on the current on the right half of the gain control system 200, and may split accordingly. For example, the positive current $I_{toT235}$ may meet with a negative current $I_{toT245}$. The current traveling to the output terminal 215 may then be expressed as the summation of the positive current $I_{toT235}$ and the negative current $I_{toT245}$. A similar procedure with reversed polarity may occur at junction point 290.

Figure 5:
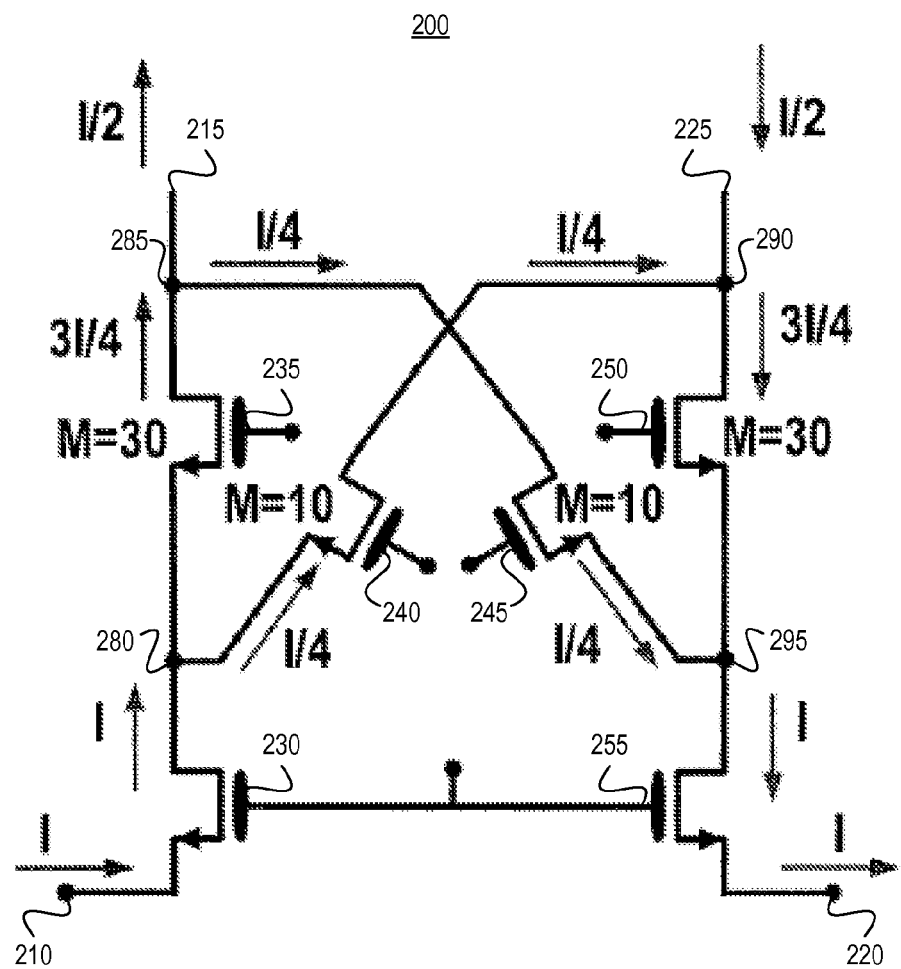
FIG. 5 is a block diagram of an example operation of a gain control system in an amplifier.

FIG. 5 shows a numerical example block diagram of the cross-coupled gain control system 200 when the transistors 240 and 245 are operating. In this configuration, M may refer to the number of fingers in the MOS transistors 235, 240, 245, and 250. The transistors 240 and 245 may be MOSFETs with 10 fingers (M=10), and the transistors 235 and 250 may be MOSFETS with 30 fingers (M=30). Transistors with larger M values may have a larger area, a larger transconductance ("$g_m$"), and a lower impedance ($Z=1/g_m$, neglecting the output resistance of the transistor). The transistors 240 and 245 have one third the input impedance of the transistors 235 and 250.

An input alternating current ("I") is input into the gain control system 200 at input terminal 210. When the transistor 230 is powered on, substantially all of the input alternating current I may go through the transistor 230 and to junction point 280. At junction point 280, the current may split according to the input impedances of the transistors 235 and 240. For example, the amount current that may split and travel may be equal to:

$$I_{to\ T235} = M_{235}/(M_{240}+M_{235}) = Z_{240}/(Z_{240}+Z_{235}) = 3I/4$$

$$I_{to\ T240} = M_{240}/(M_{240}+M_{235}) = Z_{235}/(Z_{240}+Z_{235}) = I/4$$

As such, 3I/4 may split and flow through transistor 235, and I/4 may flow through transistor 240.

Because the cross-coupled gain control system 200 is symmetrical, and because the current flows in the reverse direction, negative I/4 of the current at block 295 flows through the transistor 245, and negative 3I/4 flows through the transistor 250. Stated another way, positive I/4 flows through transistor 245 to the junction point 295 and positive 3I/4 flows through the transistor 250 to the junction point 295. As such, of the 3I/4 current from transistor 235 that reaches the junction point 285, I/4 flows through the transistor 245, and I/2 flows to the output terminal 215. A similar calculation and configuration occurs on the opposite side of the gain control system 200.

The gain of this cross coupled gain control system 200 of FIG. 5 is equal to the magnitude of the output current divided by the input current. In this example, the gain is I/2, or −6 dB. As such, the gain control amplifier 200 in this configuration may operate to reduce a maximum gain of the amplifier 100 by 6 dB (−3 dB for each half of the gain control amplifier 200). Accordingly, the configuration of the gain control system 200 in FIG. 4 produces twice the gain variation to the configuration in FIG. 5.

The cross-coupled gain control system 220 allows for some alternating current to go through the cross-coupled transistors, and some to go through a direct path. By modifying an impedance of one or more of the transistors 235, 240, 245, and 250, a current magnitude at the output terminal 215 of the gain control system 200 may be modified, and a gain realized by the gain control system 200 may be controlled.

The gain control system 200 may also create or generate noise. Noise may be or represent a random corruption of the signal. Noise may change the bias of a transistor momentarily with time and very slightly, such that the $g_m$ of a transistor may momentarily change. For example, the transistors inside the gain control system 200, such as transistors 235 and 250 may each generate a noise. The noise of transistors 235 and 250 may, in some instances, circulate through the system (such as in FIG. 4) or may leak to the output (such as in FIG. 5).

Noise of a transistor may be modeled as noise with a voltage source to the gate. A gain from the voltage source to the output ("$V_{s-o}$") may be represented as:

$$V_{s\text{-}o} = g_{mT235}/(1 + g_{mT235} * r_{obs})$$

where $g_{mT235}$ is a transconductance of the transistor 235, and $r_{obs}$ represents a resistance observed from the source downward. The product $g_{mT235} * r_{obs}$ may be referred to as a loop gain.

When, as in FIG. 4, the two transistors 240 and 245 are disabled or powered off, the noise created or generated by the other transistors in the gain control system 200 may circulate and may not show up at the output. In this example:

$$r_{obs} = g_{mT235} * r_o * Rs$$

where $r_o$ is the output resistance of the transistor 230 and Rs is the resistance of the source resistor 180. In this example, $g_{mT235} * r_o$ may be, for example, on the order of ten times the magnitude of Rs. Accordingly, $r_{obs}$ may be a fairly large value, and only a very low noise of the transistor may appear at the output. The noise of the cascode transistor 235 in this system may be heavily attenuated and may not contribute to the output noise.

In a configuration of the cross-coupled gain control system 200 where cross-coupling is enabled (such as where the transistors 240 and 245 are powered on in FIG. 5), the noise level which may leak to the output terminals 215 and 225 may be much higher. This is because the value of $g_{mT235} * r_o$ in $r_{obs}$ may be greatly reduced by a having parallel impedances at the transistor 235. With smaller impedances, and a smaller $r_{obs}$, the denominator of the $V_{s\text{-}o}$ calculation is reduced, and the total noise value is greatly increased. This represents a noise penalty that results from the cross-coupling necessary to achieve a gain control with the gain control system 200.

Figure 6:
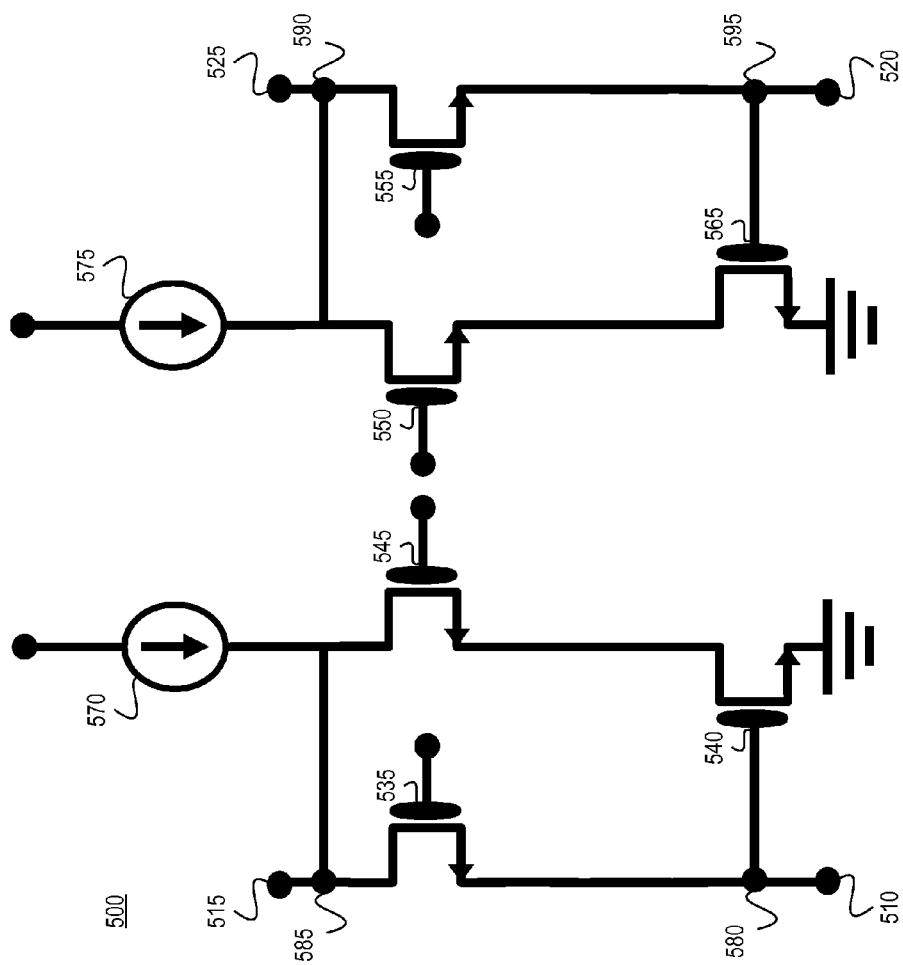
FIG. 6 is a block diagram of an example gain control system in an amplifier.

FIG. 6 shows an alternative example of a gain control system 500 which may be used as a gain control system 140 or 145 with an amplifier 100. The gain control system 500 may be used to achieve gain control while reducing or minimizing noise of the gain control system 500.

The gain control system 500 may have one or more input terminals 510 and 520. Input terminals 510 and 520 may be similar to or resemble input terminals 210 and 220. For example, the gain control system 500 may be configured or operable to provide gain control for a differential input signal, where the input terminal 510 may receive a positive portion of the differential input signal, and input terminal 520 may receive an opposite, negative portion of the differential input signal. Alternatively, the gain control system 500 may only have one input terminal 210, may be single sided or a forward gain control system, and may be configured to provide gain control for non-differential input signals.

The gain control system 500 may include one or more output terminals 515 and 525. The one or more output terminals 515 and 525 may be similar to or resemble input terminals 215 and 225. The one or more output terminals 515 and 525 may output a signal from the gain control system 500. In some systems, the output terminals 515 and 525 may include the junction points 585 and 590 (and corresponding additions or negations of current) respectively.

The gain control system 500 may contain one or more direct current sources 570 and 575. The direct current sources 570 and 575 may provide power to one or more components of the gain control system 500, such as power or current for one or more of the transistors 545 or 550. The direct current sources 570 and 575 may be the same as, similar to, or resemble the cascode current sources formed by the cascode device 150 and the current source 155 in FIG. 2, or they may be different. The direct current sources 570 and 575 may provide a current or power to one or more other components of the gain control system 500, such as DC current for one or more of the transistors 545 and 550. The direct current sources 570 and 575 may additionally or alternatively set or control a common-mode voltage level at the output of the gain control system 500 or amplifier employing the gain control system 500. Additionally or alternatively, the direct current sources 570 and 575 may present a small-signal output impedance. The small-signal output impedance may be large, such as much larger than an impedance of a resistor, such as a resistor 160 of an amplifier 100. The small-signal output impedance may improve a linearity of an amplifier. Other variations and uses of the direct current sources 570 and 575 are possible.

The gain control system 500 may include one or more transistors 535 and 555. The gain control system 500 may also include one or more common source amplifier transistors 540 and 555. The gain control system 500 may also or alternatively include one or more control transistors 545 and 550. Each side of the gain control system 500 may be referred to as a gain reduction unit. For example, one gain reduction unit may include input terminal 510, transistors 535, 540, and 545, junction points 580 and 585, and the output terminal 515. Another gain reduction unit may include input terminal 520, transistors 550, 555, and 560, junction points 590 and 595, and the output terminal 525. Other variations are possible.

Figure 7:
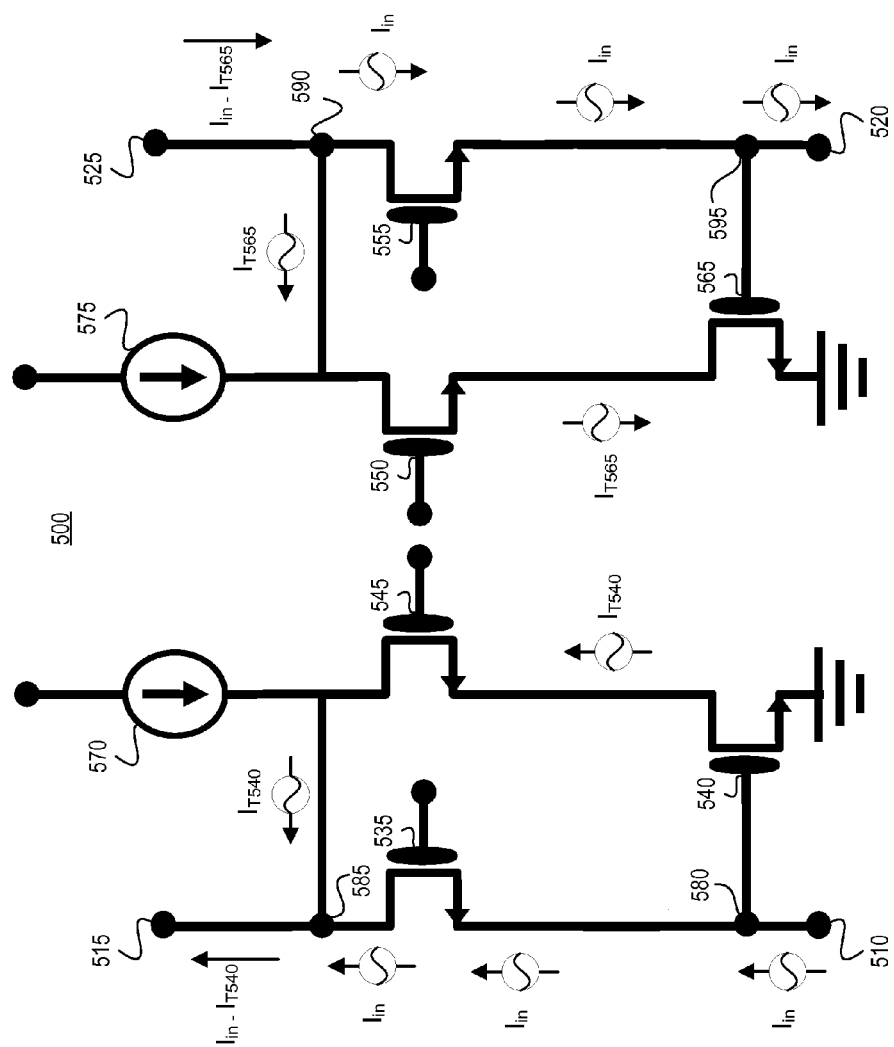
FIG. 7 is a block diagram of an example operation of a gain control system in an amplifier.

FIG. 7 shows an example operation of the gain control system 500. An input alternating current ("$I_{in}$"), with a first phase, may be received by the gain control system 500 at input terminal 510 and may pass to the junction point 580. One path from the junction point may lead to the gate of a transistor 540. However, none of the input current $I_{in}$ may pass to the transistor 540, as the path from the junction point 580 leads to the gate of the transistor 540, not a source. Accordingly, all of the input current $I_{in}$ at junction point 580 may pass to a source end of the transistor 535 and flow through transistor 535 to junction point 585.

The transistor 540 and transistor 545 may provide a gain reduction for the gain control system 500. Transistor 540 may be a common source amplifier, and may be configured and operable to generate and output a current with a phase which may be out of phase with the input current passing through the transistors 530 and 535.

While none of the input current $I_{in}$ may pass to the transistor 540, the transistor 540 may respond to a voltage generated by the input current. The input current $I_{in}$ received at the input terminal 510 may create a voltage at the junction point 580 ("$V_{jp}$"), which may be represented as:

$$V_{jp} = I_{in} * Z_{T535} = I_{in}/g_{mT535}$$

where $Z_{T535}$ is the input impedance for the transistor 535 and $g_{mT535}$ is the transconductance for the transistor 535. The voltage $V_{jp}$ may create a current for the transistor 540 ("$I_{T540}$"), which may be represented as:

$$I_{T540} = g_{mT540} * V_{jp} = I_{in} * g_{mT540}/g_{mT535}$$

where $g_{mT540}$ represents the transconductance for the transistor 540. The current generated at the transistor 540 may be a replica of the input current signal $I_{in}$, but with a different polarity. The current $I_{T540}$ generated at the transistor 540 may also be referred to as a reduction signal, reduction current, canceling signal, cancelling current.

The transistor 540 may be controlled by the transistor 545. The transistor 545 may act as a switch for the transistor 540, or may act as an adjustable magnitude transistor for the transistor 540. A source of the transistor 545 may be connected or attached with a drain of the transistor 540.

The transistor 545 may be or receive a current steering signal ("CS"), which may control whether, or to what degree, the transistor 545 may be operating. The current steering signal may, for example, be a high (or "1" or otherwise on) signal or a low (or "0" or otherwise off) signal, or a signal between a high or a low signal.

When the transistor 545 is powered or switched on, such as with a high current steering signal, the transistor 540 may transmit or output the out of phase current $I_{T540}$ to the transistor 545. All of the current may flow through the transistor 545 and subsequently to the junction point 585. Alternatively, when the transistor 545 is disabled or receives a low or "0" signal, little or no current may flow from the transistor 540 to the transistor 545 or the junction point 585.

Because the current $I_{T540}$ from the transistor 540 (which passes through transistor 545 to the junction point 585 when transistor 540 is enabled) is out of phase with, and has a different polarity than, the input current $I_{in}$ that passes through transistor 535, the current from transistor 540 may cancel or reduce a portion of the input current when the transistor 540 is active, activated, enabled, on, conducting, or otherwise powered ("on" or "active"). The final current at the output, when the transistor 540 is active, may be represented as:

$$I_{out}=I_{in}-I_{T540}=I_{in}(1-g_{mT540}/g_{mT535})$$

This cancellation or reduction in the input current may provide a gain reduction or gain control. Where the two currents meeting at the junction point 585 have the same value, the current output will be zero. However, by adjusting a ratio of the impedance of the size of transistor 540 to transistor 535, the gain control system 500 may control how much current $I_{T540}$ is transmitted by the transistor 540 to the junction point 585, or how much negative current may cancel the input current at the output terminal 515. Examples of adjusting the impedance of the transistor 540 may include changing a size of the transistor 540, or adding or subtracting one or more fingers from the transistor 540. Additionally or alternatively, the impedance of the transistor 535 may instead by adjusted in similar or different ways. Other examples are possible.

Another way to control how much current $I_{T540}$ is transmitted by the transistor 540 may be to control the current steering signal provided to the transistor 545, which controls a flow of the current $I_{T540}$ to the junction point 585. The current steering signal may be any value between a low or "0" signal and a high or "1" signal. By adjusting a current steering signal, a portion of the current from the transistor 540 which is proportional to the value of the current steering signal may be transmitted to and through the transistor 545 to the junction point 585. For example, where the current steering signal is, for example, a half or "0.5" signal, half of the current from the transistor 545 may pass to the junction point 585. In this way, by controlling the current steering signal, a user or system controller may control a level of current from the transistor 540 received at the junction point 585, and thereby control a gain reduction for the gain control system 500. By properly adjusting the level of current $I_{T540}$, the gain control system 500 may be configured to provide, for example, 6 dB or 12 dB of gain control. Other examples of adjusting a gain control are possible.

By controlling the configuration and operation of the transistor 540 and a current steering signal applied to transistor 545, the gain control of the gain control system 500 may be controlled. If the transistor 540 is disabled or not operable (such as where the transistor 545 is powered off), the gain of the gain control system 500 is at a maximum (gain from gain control system 500=1), as all of the input current from the input terminal 510 is also at the output terminal 515. By increasing the current from the transistor 540, such as by increasing a current steering signal applied to the transistor 545, the gain of the gain control system 540 may be reduced.

The transistors 545 and 550 may be referred to as gain control components. In other systems, other components may control an amount of reduction current from the transistors 540 and 565 which may be passed or otherwise conducted to the output terminal. For example one or more series of adjustable or tunable switches, resistors, or capacitors may be implemented to control the reduction signal. Various other examples are possible. The gain control components may be adjustable. The gain control components, or an impedance of the gain control components, may be controlled in various ways, such as by one or more signal such as a current steering signal. Other examples and variations are possible.

The gain control system 500 is shown with a reciprocal configuration on the opposite side of the gain control system, where a negative input signal is received at input terminal 520 and travels entirely through the transistor 555 to the junction point 590. On this reciprocal side of the gain control system 500, the transistor 565 may be powered by a voltage from the negative input current, but with an opposite polarity from the voltage powering the transistor 540. As such, when activated by a transistor 550, the transistor 565 may output a negative current $I_{T565}$ which may pass to the junction point 590 and subtract from the negative input current from the input terminal 520. In this manner, the opposite side of the gain control system 500 may provide a reciprocal, reversed polarity gain reduction.

The gain control system 500 may also minimize noise from the gain control system 500 or transistors such as transistors 535, 540, 555, and 560. Modeling the noise of a transistor (such as transistor 535) as a voltage source to the gate, the impedance observed at the source transistor 535 may be or include the input impedance of the transistor 540. The input impedance of the transistor 540 may be very high, because from the perspective of the transistor 535, the input impedance of the transistor 540 is the impedance at a gate. In contrast to an impedance at a source of a transistor (which may be approximately equivalent to the inverse of the transconductance of that transistor), the impedance at a gate of a transistor is nearly infinite. Because the impedance observed by the transistor 535 is very high, and because the noise is inversely related to the observed impedance, the noise is almost zero. The noise of the transistor 555 is similarly zero, as the impedance observed by the transistor 555 is the gate of the transistor 565.

The noise of transistors 540 and 565 may contribute some noise to the output. The impedance observed by the transistors 535 and 555 is nearly infinite, and so the noise of the transistors 535 and 555 will not change. Therefore, turning on or off the transistors 540 and 565 (such as by activating the transistors 545 and 550) may not affect the noise observed at the output terminals 515 and 525 of the gain control system 500. This may provide a benefit of allowing for a gain reduction by the gain control system 500 without incurring a significant noise penalty or having noise from a transistor (such as a cross-coupled transistor 235 of the gain control system 200) leak to an output terminal.

While the gain control system 500 is shown with two different reciprocal, reversed polarity gain reduction units, in some systems, the gain control system 500 may only contain or include one gain reduction unit. For example, in some systems, only the portion of the gain control system 500 with the transistors 535, 540, and 545 may be included in the gain control system 500. As no cross-coupling is incorporated or needed for gain reduction to be performed by the gain control system 500, the reciprocal reversed gain reduction unit may not be necessary for the gain control system 500 to reduce a gain on an input signal received at one input terminal, such as input terminal 510. This may provide an increase in flexibility of the use of the gain control system 500 with non-reciprocal input signals. Other variations are possible.

Gain control system 500 shows one transistor 535 between the junction points 580 and 585. In other systems, more than one transistor may be positioned or configured between junction points 580 and 585.

Figure 8:
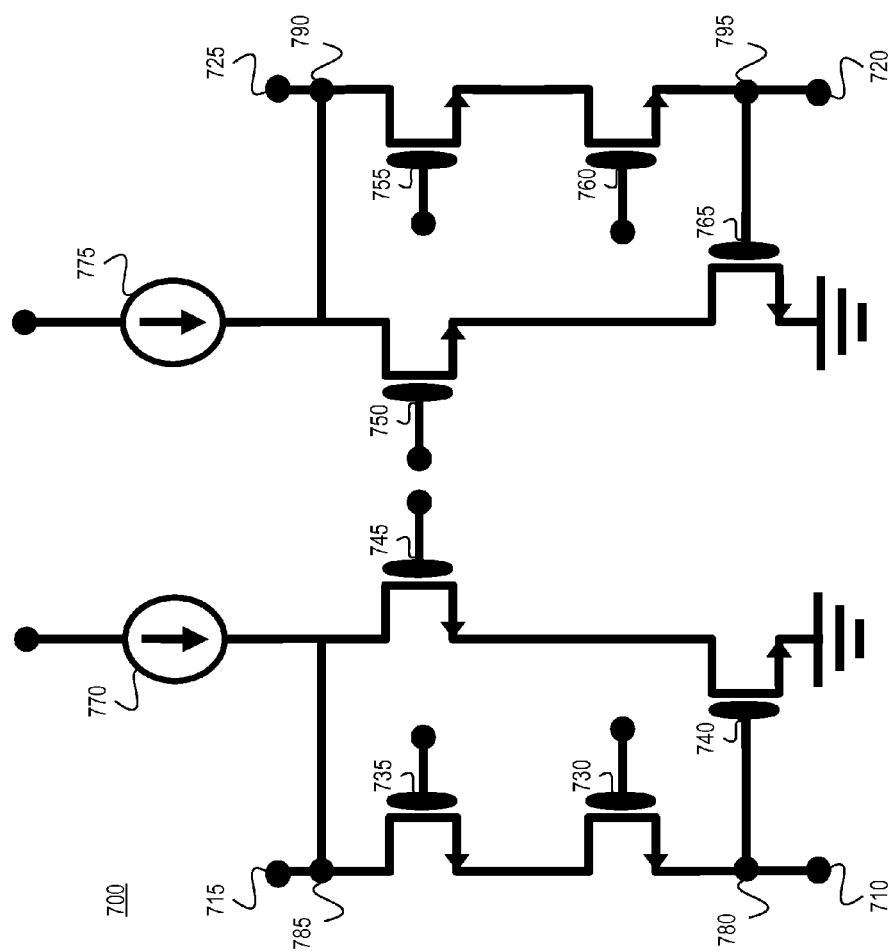
FIG. 8 is a block diagram of an example gain control system in an amplifier.

For example, FIG. 8 shows an example of an alternative gain control system 700 with two transistors between junction points. The gain control system 700 may be similar to or resemble the gain control system 500. For example, the gain control system 700 may include input terminals 710 and 720, which may be resemble and operate in a similar manner as input terminals 510 and 520. The gain control system 700 may include output terminals 715 and 725, which may be resemble and operate in a similar manner as input terminals 515 and 525. The gain control system 700 may include one or more common source amplifier transistors 740 and 755, which may be resemble and operate in a similar manner as transistors 540 and 555. The gain control system 700 may include one or more control transistors 540 and 555, which may resemble and operate in a similar manner as transistors 545 and 550. The gain control system 700 may include one or more DC current sources 770 and 775, which may resemble and operate in a similar manner as the DC current sources 570 and 575.

In contrast to the gain control system 500, the gain control system 700 may include two transistors between the junction points of a gain reduction unit. For example, the gain control system 700 may include transistors 730 and 735 between junction points 780 and 785, as well as transistors 755 and 760 between the junction points 790 and 795.

Operation and flow of current in the gain control system 700 may be similar to operation or flow of current in the gain control system 500. For example, an input current $I_{in}$ received by the gain control system 700 at input terminal 710 may pass to the junction point 780. As the path at the junction point 780 to the transistor 740 leads to a gate of the transistor, none of the input current may pass to the transistor 540. As such, all of the input current at junction point 780 may pass to and flow through transistors 730 and 735 to junction point 785.

As in the gain control system 500, the transistor 740 and transistor 745 may provide a gain reduction for the gain control system 700. Transistor 740 may be a common source amplifier, and may be configured and operable to generate and output a current with a phase which may be out of phase with the input current, in a manner similar to the generation of the current at the transistor 540. Transistor 745 may control and act as a switch for the transistor 740, in a manner similar to the operation of the transistor 545.

As such, because the current from the transistor 740 (which passes through transistor 745 to the junction point 785 when transistor 740 is enabled) is out of phase with, and has a different polarity than, the input current that passes through transistors 730 and 735, the current from transistor 740 may cancel or reduce a portion of the input current when the transistor 740 is active, enabled, or otherwise powered. The final current at the output, when the transistor 740 is active, may be represented as:

$$I_{out}=I_{in}-I_{T740}=I_{in}*(1-g_{mT740}/g_{mT730})$$

The gain reduction unit on the other side of the gain control system 700 (which may include input terminal 720, transistors 750, 755, 760, and 767, junction points 790 and 795, and output terminal 725), may operate in a reverse manner with an opposite polarity.

The gain control system 700 may operate to reduce or minimize a noise from the transistors in a manner similar to that of gain control system 500. In gain control system 700, the input impedance of the transistor 740 is in series with the impedances of the other transistors 730 and 735. As the input impedance of the transistor 740 is nearly infinite, and as the noise is related to an inverse of the input impedance of the transistor 740, the noise may be very small or minimized.

Figure 9:
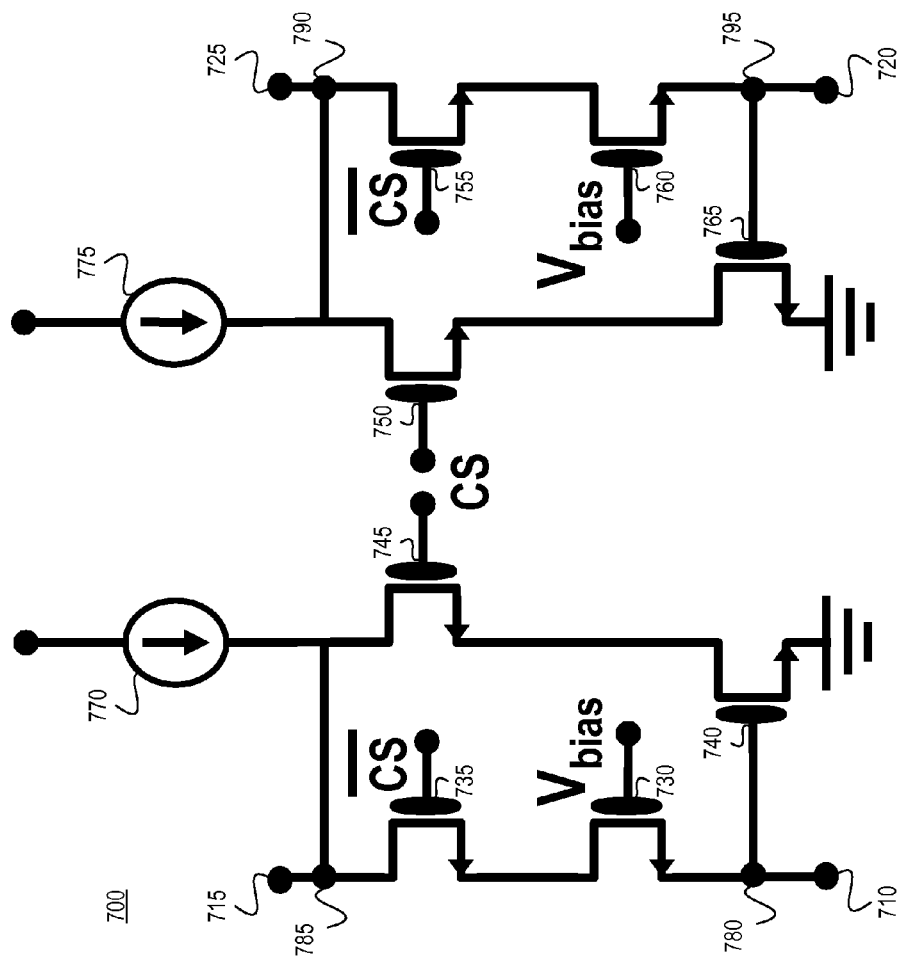
FIG. 9 is a block diagram of an example operation of a gain control system in an amplifier.

In some systems, the configuration of the gain control system 700 with two transistors between the junction points may provide some benefits. FIG. 9 shows the gain control system 700 with example control signals provided to some of the transistors.

In FIG. 9, a voltage (denoted "$V_{bias}$") may be applied to the transistors 730 and 760. In some instances, $V_{bias}$ may bias the transistors 730 and 760 for a proper current, but may not provide any switching for the transistors. These transistors 730 and 760 may be configured to be on continuously or whenever the voltage $V_{bias}$ is great enough to activate the transistors 730 and 760.

In addition, the gain control system 700 may apply a current steering signal ("CS") to the two control transistors 745 and 750, while the inverse or opposite of the current steering signal may be applied to transistors 735 and 755. As such, in this configuration, when the current steering signal is high, a "1", or otherwise on, the currents $I_{T740}$ and $I_{T765}$ generated at the transistors 740 and 765 pass through the transistors 745 and 750 and to the junction points 785 and 790 respectively. At the same time, because the current steering signal is high, a "1", or otherwise on, the inverse or opposite of the current steering signal is low, a "0", or otherwise off. As such, the transistors 735 and 755 are not powered on, and none of the input current will arrive at the junction points 785 and 790. Thus, when the current steering signal is high, the signal at the output terminals 715 and 725 is only the currents $I_{T740}$ and $I_{T765}$ generated at the transistors 740 and 765. In this configuration, the gain control system 700 may produce a negative gain which may be represented as:

$$\text{Gain}=(I_{T740}/I_{in})$$

$$G(\text{dB})=20 \log(I_{T740}/I_{in})$$

As such, when the current steering signal is high, the gain may depend or be related to the value of the current $I_{T740}$ generated at the transistor 740 (or transistor 765 on the reverse side).

If instead the current steering signal is low, a "0", or otherwise off, the transistors 745 and 750 may be off, and the currents $I_{T740}$ and $I_{T765}$ generated at the transistors 740 and 765 may not pass through the transistors 745 and 750 to the junction points 785 and 790. At the same time, because the current steering signal is low, a "0", or otherwise off, the inverse or opposite of the current steering signal is high, a "1", or otherwise on. As such, the input current may flow through the transistors 730 and 735 (or 760 and 755 on the in the opposite gain reduction unit) to the junction point 785 (or the junction point 790 on the opposite gain reduction unit). In this example, only the input current appears at the junction points 785 and 790, and therefore only the input currents will appear at the output terminals 715 and 725. In this configuration, the gain control system 700 may have a maximum gain, or a gain of 1.

The configuration and operation of the gain control system 700 may be useful in various situations and settings, such as where two or more gain control systems 700 may be configured or arranged in parallel, series, or a combination of parallel and series with each other. As an example, a set of gain control systems 700 may be configured in parallel with each other. A computer system, processor, or other control system ("computer system") may control a portion or percentage of the parallel gain control systems 700 in a first way (such as with a high, "1", or otherwise on current steering signal). The computer system may control the remainder portion or percentage of the parallel gain control systems 700 in a second way (such as with a low, "0", or otherwise off current steering signal). A user or computer system may adjust or control the portion or percentage of parallel gain control systems 700 controlled in the first way and the portion or percentage of the gain control systems controlled in the second way. By adjusting the portions or percentages, the user or computer system may be able to achieve a desired total gain from the two or more parallel gain control systems 700 without having to affect or monitor the exact level of a current steering signal.

As a specific example, 100 gain control systems 700 may be configured in parallel with each other. Where an operator or computer system desires to have a maximum gain, a current steering signal that is low, "0", or otherwise off may be sent to all 100 of the gain control systems 700. In this case, each of the gain control systems 700 may only allow the input current to reach the output terminals, with no current from transistors 740 or 765 reaching those points. As the operator or system desires to reduce a gain, a current steering signal that is high, "1", or otherwise on may be sent to some of the gain control systems 700, while a current steering signal that is low, "0", or otherwise off may be sent to the rest of the gain control systems 700. The more current gain control systems 700 that are transmitted a high, "1", or otherwise on current steering signal, the smaller the gain of the set of gain control systems 700 collectively may be. Configuring multiple gain control systems 700 together in parallel may allow an operator or computer system to control a desired gain reduction without adjusting the transistors 740 and 765 or the a level of the input voltage that may be used to otherwise control a gain of the gain control systems 700.

In other systems, the current steering signals (and opposite current steering signals) may not be limited to a high or "1" value and a low or "0" value. Rather, the current steering signal may be any value between a high or "1" value and a low or "0" value. A computer system may control a gain control in these systems by using fractional or partial current steering signals. By allowing for an adjustable current steering signal, a higher granularity or flexibility in gain reduction by the gain control systems may be achieved.

In other example gain control systems 700, the current steering signal applied to the transistors 735 and 745 (or 750 and 755) may not be related at all. For example, a second $V_{bias}$ signal may be applied to transistor 735, such that the transistor 735 may always operate. In this example, a gain reduction may be controlled by controlling a level of a current steering signal applied to the transistor 745, such as by adjusting a level of the current steering signal between a high or "1" level and a low or "0" level to achieve a desired current from the transistor 740. Other examples are possible.

One or more gain control systems, such as a gain control system 200, 500, or 700, may be applied or connected in series in an amplifier 100. For example, amplifier 100 is shown with two gain control systems 140 and 145 in series with each other. In a series configuration, one of the gain control systems 140 may be directly connected to a current input source. The current input source may apply the input current at input terminals (such as input terminals 510 and 520, or 710 and 720) of the gain control system 140. The outputs of the gain control system 140 may act as inputs of the gain control system 145. As such, signals passing through output terminals of the gain control system 140 (such as output terminals 515 and 525, or 715 and 725), may then be treated as input signals and received at the input terminals of the next gain control system 145. Any number of gain control systems 140 and 145 may connected together in this fashion. Different gain control systems may be applied in series with each other (such as connecting a gain control system 500 in series with a gain control system 700), or the same types of gain control systems may be connected in series. In some instances, two gain control systems arranged in series, or two gain reduction units arranged in series, may be referred to as one gain control system. Other variations are possible.

Figure 10:
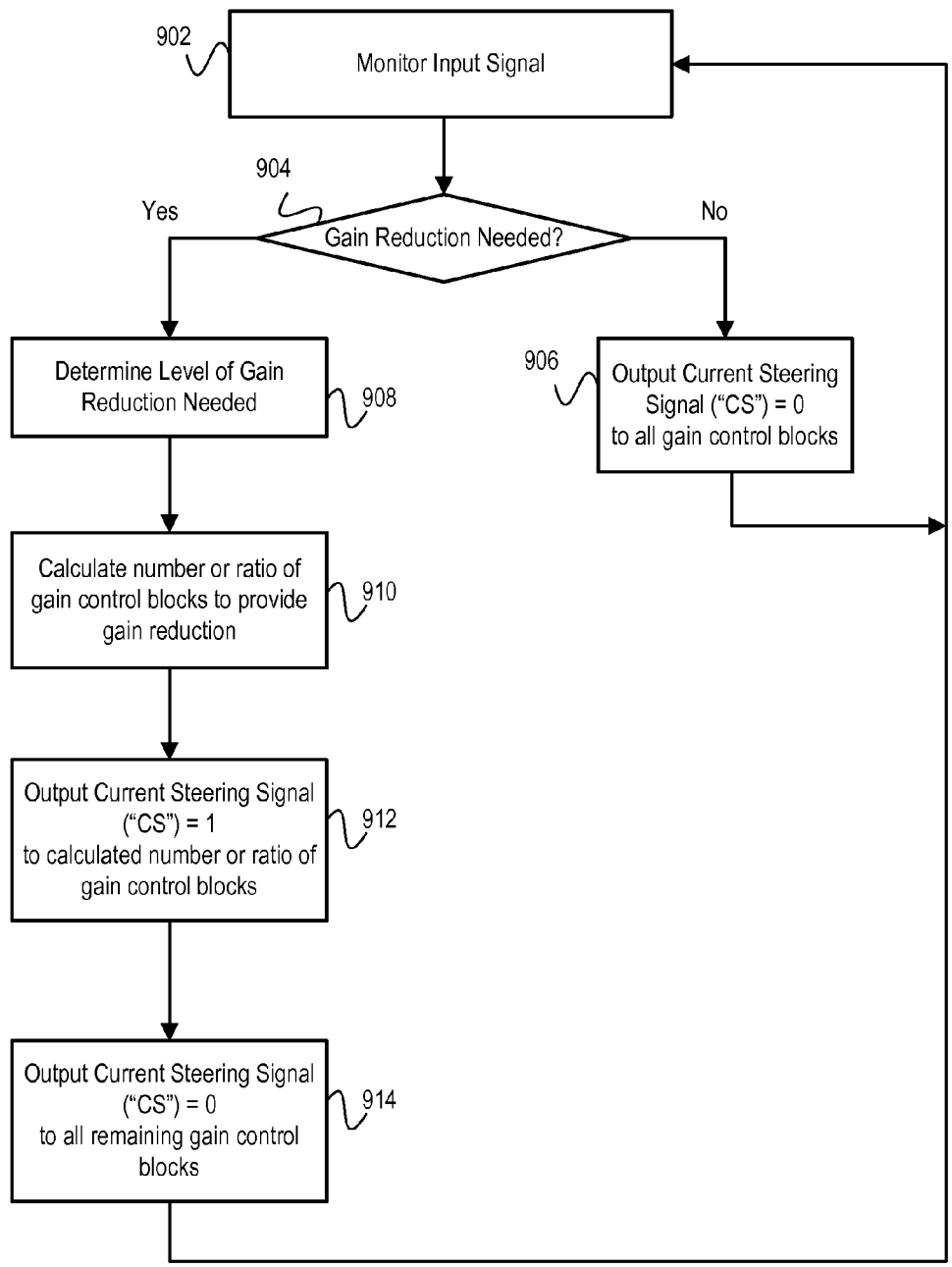
FIG. 10 is a flow diagram of an example method for operating gain control systems in an amplifier.

FIG. 10 illustrates an example method that a computer system may implement to control a set of gain control systems 700 arranged in parallel, series, or a combination of parallel and series with each other. The method may begin at block 902, where an input signal may be monitored. A computer system may monitor an input signal to determine if a gain reduction of the signal may be needed.

In block 904, the computer system may determine if a gain reduction is needed. The determination may be based, for example, on a monitoring of the input signal performed in block 902. For example, where the computer system determines that the input signal is too great, that an amplifier 100 may clip a signal, or that the signal otherwise has a property or characteristic which may warrant a reduction in gain, the computer system may determine in block 904 that a gain reduction is needed. If no such event occurs, the computer system may determine that no gain reduction is needed.

Where no gain reduction is needed, the method may proceed to block 906. At block 906, the computer system may output a current steering signal that is low, "0", or otherwise off to all of the gain control systems 700. Where the gain control systems 700 receive the low, "0", or otherwise off current steering signal, all of the input current received by the gain control systems 700 may proceed to the output terminals, with no gain reduction from transistors 740 and 765. As such, the gain from the gain control systems 700 is 1, and no gain is reduced by the gain control systems 700. Afterwards, the method may return to block 902 where the input signal may continue to be monitored.

Returning to block 904, where instead the computer system determines that a gain reduction is necessary, the method may proceed to block 908. At block 908, the computer system may determine a level of gain reduction that is needed. For example, where the input signal may be great enough that the amplifier may clip the input signal, the computer system may calculate, with one or more functions or algorithms, an amount by which the gain can be reduced to minimize or eliminate the clipping. Other examples are possible.

At block 910, the computer system may calculate a number or ratio of gain control systems 700 that may be needed to be supplied with a high current steering signal to provide the determined gain reduction. The calculation may be based or result in only a number or ratio of gain control systems 700 to be controlled (such as where all of the gain control systems 700 are substantially identical and configured in parallel with each other), or may result in a determination of a specific configuration or set of gain control systems 700 to be controlled (such as where the gain control systems 700 may not be substantially identical or are configured in variations of series and parallel). This calculation may be performed using one or more functions or algorithms. The calculation may account for a contribution and impact of a current from a transistor 740 and 765 in one or more of the gain control systems 700 on a total current received at an output. Such a contribution and impact may be based on or related to a configuration of the gain control systems 700 and one or more characteristics of the input current or transistors 740 and 765. Other variations are possible.

At block 912, the computer system may then output a high, "1", or otherwise on current steering signal to the calculated number or ratio of gain control systems 700 that may be needed to provide the gain reduction. At block 914, the computer system may then output a low, "0", or otherwise off current steering signal to the remainder of the gain control systems 700 that may not be needed to provide the gain reduction. Afterwards, the method may return to block 902 where the input signal may continue to be monitored. In this way, for example, a computer system may control a set of gain control systems 700 to provide a desired gain reduction to a signal. While the method of FIG. 10 considers a case where the current steering signal is either a high or a low signal, other methods may be implemented where the computer system may generate or apply a current steering signal which may be any value between a high and a low value. Other variations and methods may be used by a computer system to control a set of gain control systems 700 or control a gain reduction of a signal by a gain control system 140 in an amplifier 100.

Figure 11:
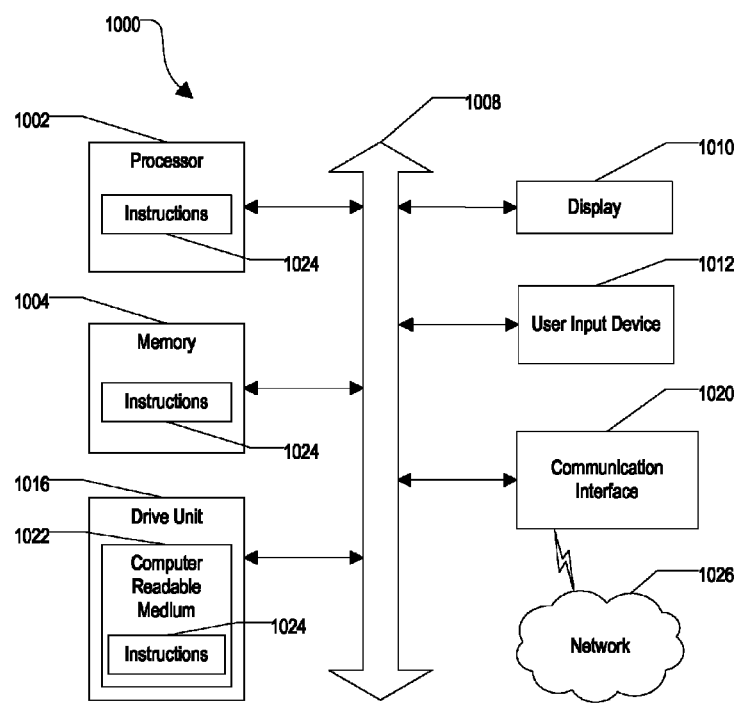
FIG. 11 is a block diagram of an example computer system of an electronic device for use with controlling a gain control system in an amplifier.

FIG. 11 shows an example computer system 1000 with one or more components that may be used with or included in the electronic device 10. One or more components of the computer system 1000 may be in communication with and control one or more of the amplifier 30 or gain control system 40 of the electronic device 10. For example, a processor may be included with a set of gain control systems 700 to monitor an input signal or control a gain reduction of the set of gain control systems 700. Other examples are possible.

The computer system 1000 may include a set of instructions that can be executed to cause the computer system 1000 to perform any one or more of the methods or computer based functions disclosed herein. The computer system 1000 may operate as a standalone device or may be connected, such as using a network, to other computer systems or peripheral devices. The computer system 1000 may include a processor 1002, such as a central processing unit (CPU), a graphics processing unit (GPU), or both. The processor 1002 may be a component in a variety of systems, such as processor 50 in the electronic device 10. The processor 1002 may be part of a standard personal computer or a workstation, or may be one or more general processors, digital signal processors, application specific integrated circuits, field programmable gate arrays, servers, networks, digital circuits, analog circuits, combinations thereof, or other now known or later developed devices for analyzing and processing data. The processor 1002 may implement a software program, such as code generated manually (i.e., programmed).

The computer system 1000 may include a memory 1004 that may communicate via a bus 1008. The memory 1004 may be a main memory, a static memory, or a dynamic memory. The memory 1004 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like.

The memory 1004 may be operable to store instructions executable by the processor 1004. The functions, acts or tasks illustrated in the figures or described herein may be performed by the programmed processor 1004 executing the instructions stored in the memory 1004. The functions, acts or tasks may be independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

The computer system 1000 may further include a display unit 1010, such as a liquid crystal display (LCD), an organic light emitting diode (OLED), a flat panel display, a solid state display, a cathode ray tube (CRT), a projector, a printer or other now known or later developed display device for outputting determined information. The display 1010 may act as an interface for the user to see the functioning of the processor 1002, or specifically as an interface with the software stored in the memory 1004 or in the drive unit 1016.

The computer system 1000 may include an input device 1012 configured to allow a user to interact with any of the components of system 1000. The input device 1012 may be a number pad, a keyboard, or a cursor control device, such as a mouse, or a joystick, touch screen display, remote control or any other device operative to interact with the computer system 1000.

The computer system 1000 may also or alternatively include a disk or optical drive unit 1016. The disk drive unit 1016 may include a computer-readable medium 1022 in which one or more sets of instructions 1024, e.g. software, can be embedded. Further, the instructions 1024 may embody one or more of the methods or logic as described herein. The instructions 1024 may reside completely or partially within the memory 1004 and/or within the processor 1002 during execution by the computer system 1000. The memory 1004 and the processor 1002 also may include computer-readable media as discussed above.

In some systems, a computer-readable medium 1022 includes instructions 1024 or receives and executes instructions 1024 responsive to a propagated signal so that a device connected to a network 1026 can communicate voice, video, audio, images or any other data over the network 1026. Instructions 1024 may be transmitted or received over the network 1026 via a communication port or interface 1020, and/or using a bus 1008. The connection with the network 1026 may be a physical connection, such as a wired Ethernet connection or may be established wirelessly as discussed below. The additional connections with other components of the system 1000 may be physical connections or may be established wirelessly. The network 1026 may alternatively be directly connected to the bus 1008.

While the computer-readable medium 1022 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding or carrying a set of instructions for execution by a processor or that cause a computer system to perform any one or more of the methods or operations disclosed herein. The computer-readable medium 1022 may be non-transitory, and may be tangible.

The computer-readable medium 1022 can include a solid-state memory such as a memory card or other package that houses one or more non-volatile read-only memories. The computer-readable medium 1022 can be a random access memory or other volatile re-writable memory. Additionally or alternatively, the computer-readable medium 1022 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The gain control systems and methods described may provide numerous benefits or advantages. The gain control systems 500 and 700 may, for example, not be or need to be cross-coupled. The gain control systems 500 and 700 may be used to provide gain reduction to non-differential input signals. The gain control systems 500 and 700 may provide gain reduction while minimizing output noise or a noise penalty for the gain reduction. Noise reduction or minimization of a noise penalty may be accomplished irrespective of whether gain reducing transistors are active or disabled. The gain control systems and methods described may have various other benefits and advantages.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A gain control system, comprising:
    an input terminal that receives an input signal;
    a first transistor having a source connected with the input terminal and a drain connected with an output terminal;
    a second transistor having a gate connected with the input terminal and the source of the first transistor, the second transistor having a drain connected with the output terminal, the second transistor generating a reduction signal; and
    where the output terminal outputs an output signal based on the input signal and the reduction signal, and where a level of the reduction signal is controlled by a current steering signal.

2. The gain control system of claim 1, where the input signal is an alternating current signal with a first phase, and where the reduction signal is an alternating current signal with a second phase opposite the first phase.

3. The gain control system of claim 1, further comprising a gain control component connected with the second transistor, the gain control component controlling an amount of the reduction signal received at the output terminal.

4. The gain control system of claim 3, where the gain control component receives the current steering signal that controls an impedance of the gain control component.

5. The gain control system of claim 4, where the the current steering signal is also used to control gain.

6. The gain control system of claim 1, where the gate of the second transistor impedes noise of the first transistor from leaking to the output terminal.

7. A gain control system comprising:
    an input terminal that receives an input signal;
    a first transistor having a source connected with the input terminal, and a drain connected with an output terminal;
    a second transistor having a gate connected with the input terminal and the source of the first transistor, the second transistor generating a reduction signal; and
    a third transistor having a source connected with a drain of the second transistor, and a drain connected with the output terminal, where an impedance of the third transistor is inversely controlled by a current steering signal; and
    where the output terminal outputs an output signal based on the input signal and the reduction signal, and where a level of the reduction signal is controlled by the current steering signal.

8. The gain control system of claim 7, where an impedance of the third transistor controls an amount of the reduction signal received at the output terminal.

9. The gain control system of claim 7, where an impedance of the first transistor is inversely controlled by a current steering signal.

10. The gain control system of claim 7, further comprising:
    a second input terminal that receives a second input signal opposite first input signal;
    a fourth transistor having a source connected with the second input terminal, and a drain connected with a second output terminal;
    a fifth transistor having a gate connected with the second input terminal and the source of the fourth transistor; and
    a sixth transistor having a source connected with a drain of the fifth transistor, and a drain connected with the second output terminal.

11. The gain control system of claim 10, where the fifth transistor generates a second reduction signal, and where the second output terminal outputs a second output signal based on the second input signal and the second reduction signal.

12. The gain control system of claim 7, further comprising:
    a second input terminal that receives the output signal;
    a fourth transistor having a source connected with the second input terminal, and a drain connected with a second output terminal;
    a fifth transistor having a gate connected with the second input terminal and the source of the fourth transistor; and
    a sixth transistor having a source connected with a drain of the fifth transistor, and a drain connected with the second output terminal.

13. The gain control system of claim 7, where the gate of the second transistor impedes noise of the first transistor from leaking to the output terminal.

14. A method of controlling a gain of an amplifier, comprising:
    calculating a gain reduction for an amplifier;

identifying, based on the calculated gain reduction, a subset of gain control systems from a set of gain control systems connected with the amplifier, the gain control systems outputting an input signal when a high current steering signal is received and outputting a reduction signal when a low current steering signal is received;

transmitting a high current steering signal to the identified subset of gain control systems; and transmitting a low current steering signal to the gain control systems not in the identified subset of gain control systems.

15. The method of claim 14, where the input signal is an alternating current signal with a first phase, and where the reduction signal is an alternating current signal with a second phase opposite the first phase.

16. The method of claim 14, where the input signal has a first magnitude and a first polarity, and where the reduction signal has a second magnitude equal to the first magnitude and a second polarity opposite the first polarity.

17. The method of claim 14, where the gain control systems are connected in parallel.

18. The method of claim 14, where the input signal is same for the gain control systems.

19. The method of claim 18, further comprising:

monitoring the input signal;

adjusting the calculated gain reduction based on changes in the input signal; and identifying a new subset of gain control systems based on the adjusted calculated gain reduction.

20. The method of claim 19, further comprising:

transmitting the high current steering signal to the identified new subset of gain control systems based on changes in the input signal; and transmitting the low current steering signal to the gain control systems not in the identified new subset of gain control systems based on changes in the input signal.

* * * * *